United States Patent
Yu et al.

(10) Patent No.: US 8,786,296 B2
(45) Date of Patent: Jul. 22, 2014

(54) RESISTANCE-MEASURING CIRCUIT AND ELECTRONIC DEVICE USING THE SAME

(75) Inventors: Qi-Long Yu, Shenzhen (CN); Tsung-Jen Chuang, New Taipei (TW); Jun Zhang, Guangdong (CN); Jun-Wei Zhang, Guangdong (CN); Shih-Fang Wong, New Taipei (TW); Jian-Jun Zhou, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 336 days.

(21) Appl. No.: 13/278,075

(22) Filed: Oct. 20, 2011

(65) Prior Publication Data
US 2012/0217984 A1    Aug. 30, 2012

(30) Foreign Application Priority Data
Feb. 28, 2011    (CN) .......................... 2011 1 0047664

(51) Int. Cl.
*G01R 27/08* (2006.01)
(52) U.S. Cl.
USPC ........................... 324/710; 700/298; 323/283
(58) Field of Classification Search
CPC ........ G01R 27/14; Y02E 40/34; H02M 3/156
USPC ........................... 324/710; 323/283; 700/298
See application file for complete search history.

(56) References Cited

U.S. PATENT DOCUMENTS

2010/0114399 A1*  5/2010  Higuchi et al. ............... 700/298
2011/0148378 A1*  6/2011  Grek .............................. 323/283

* cited by examiner

*Primary Examiner* — Patrick Assouad
*Assistant Examiner* — Sean Curtis
(74) *Attorney, Agent, or Firm* — Novak Druce Connolly Bove + Quigg LLP

(57) ABSTRACT

A resistance-measuring circuit includes a controller for outputting a PWM signal and further for adjusting the duty cycle of the PWM signal, and a sampling circuit for processing the PWM signal and transmitting the processed PWM signal to the sensor. The sampling circuit samples the signal outputted from the sensor to generate a sampled signal with the voltage thereof changing according to any change in the duty cycle of the PWM signal, and further transmits the sampled signal to the controller. The controller obtains the real-time duty cycle of the PWM signal when the voltage of the sampled signal reaches a threshold voltage, and further calculates the exact resistance of the sensor according to the obtained real-time duty cycle of the PWM signal and the threshold voltage. An electronic device with the resistance-measuring circuit is also provided.

12 Claims, 2 Drawing Sheets

RESISTANCE-MEASURING CIRCUIT AND ELECTRONIC DEVICE USING THE SAME

CROSS-REFERENCES TO RELATED APPLICATION

This application claims foreign priority benefits under 35 U.S.C. §119(a)-(d) to China CN201110047664.X filed on Feb. 28, 2011, which is hereby incorporated by reference in its entirety.

BACKGROUND

1. Technical Field

The present disclosure relates to electronic devices, and particularly to an electronic device with a resistance-measuring circuit.

2. Description of Related Art

Many electronic devices include a sensor for detecting the conditions surrounding the electronic device, such as temperature, humidity, and the light intensity. Most of the sensors are resistance-type, and detect the above recited information by presenting a changeable resistance. Currently, such a resistance is measured by using a constant-current source in combination with an A/D converter. However, the A/D converter needs to use an A/D converting circuit, which may result in more complex circuitry. Furthermore, the accuracy of an A/D converting circuit also influences the apparent results detected.

SUMMARY

A resistance-measuring circuit is provided. The resistance-measuring circuit includes a controller for outputting a PWM signal and further for adjusting the duty cycle of the PWM signal, and a sampling circuit for processing the PWM signal and transmitting the processed PWM signal to the sensor. The sampling circuit samples the signal outputted from the sensor to generate a sampled signal with the voltage thereof changing according to any change in the duty cycle of the PWM signal, and further transmits the sampled signal to the controller. The controller obtains the real-time duty cycle of the PWM signal when the voltage of the sampled signal reaches a threshold voltage, and further calculates the exact resistance of the sensor according to the obtained real-time duty cycle of the PWM signal and the threshold voltage.

An electronic device with the resistance-measuring circuit is also provided.

Other advantages and novel features will be drawn from the following detailed description of the embodiments with reference to the attached drawings.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiment. Moreover, in the drawings, like reference numerals designate corresponding parts throughout the views.

DETAILED DESCRIPTION

Embodiments of the present disclosure will now be described in detail with reference to the drawings.

Figure 1:
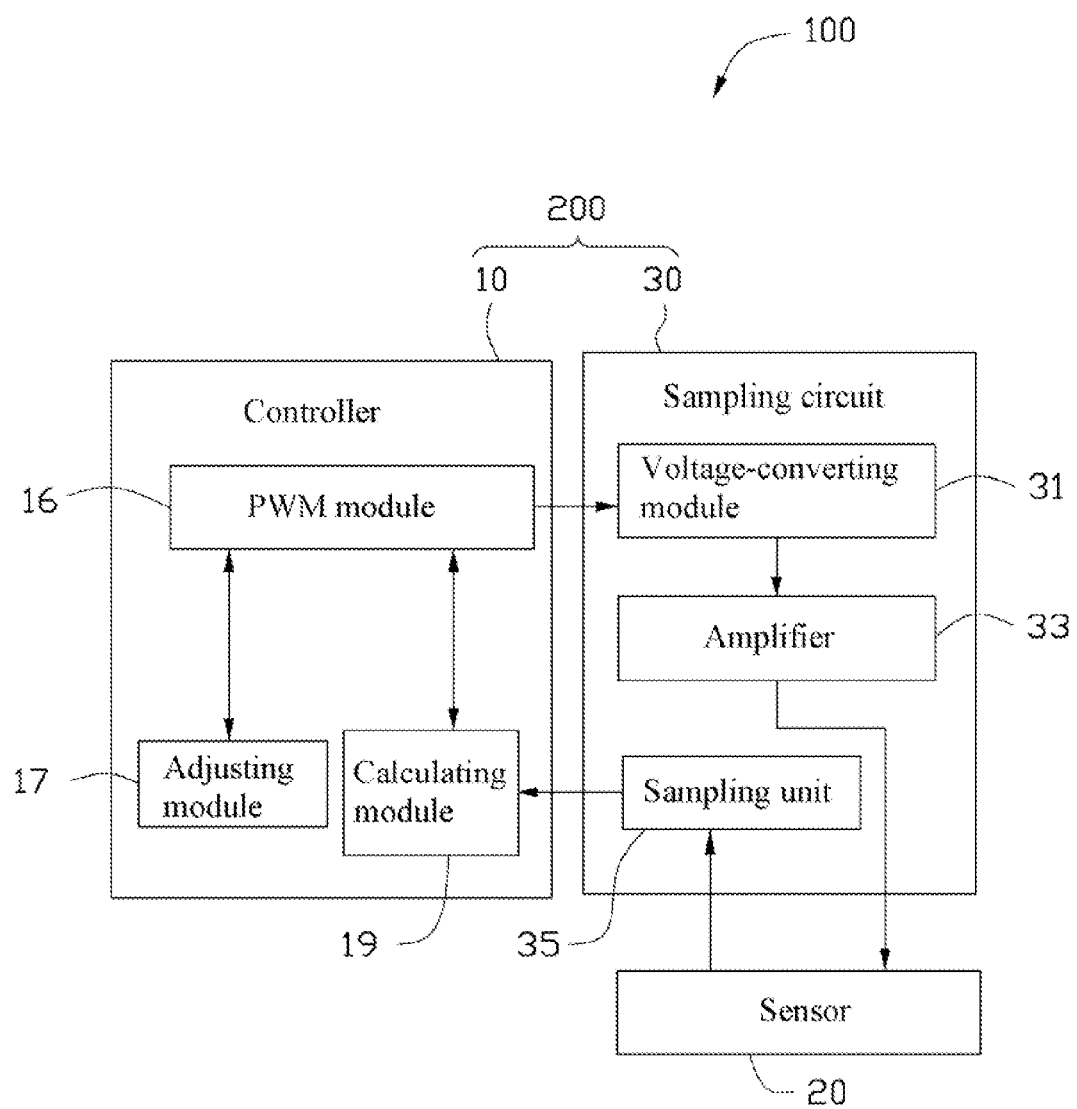
FIG. 1 is a block diagram of an electronic device according to an exemplary embodiment, including a resistance-measuring circuit.

Referring to FIG. 1, an electronic device 100 according to an embodiment is illustrated. The electronic device 100 includes a sensor 20 and a resistance-measuring circuit 200 for measuring the resistance of the sensor 20. The resistance-measuring circuit 200 includes a controller 10, and a sampling circuit 30 electrically connecting the controller 10 to the sensor 20.

The sensor 20 is used for detecting ambient environmental information around the electronic device 100 or information of some internal sensors of the electronic device 100. The information may concern temperature, humidity, and light intensity, and the internal sensors of the electronic device 100 may concern acceleration, and positional information for example. In the embodiment, the sensor 20 has a variable resistor (not shown) therein, and the sensor 20 obtains and relays information based on changes detected in the resistance of the variable resistor.

The controller 10 is used for controlling the sampling unit 30 to sample signals output from the sensor 20. The controller 10 includes a Pulse Width Modulation (PWM) module 16, an adjusting module 17, and a calculating module 19. The PWM module 16 is used for generating a PWM signal. The adjusting module 17 is used for adjusting the duty cycle of the PWM signal. The calculating module 19 is used for obtaining the real-time duty cycle of the PWM signal when the voltage of the sampled signal reaches a threshold voltage, and further to calculate the resistance of the sensor 20 according to the real-time duty cycle and the threshold voltage. Therefore, based on the calculated resistance of the sensor 20, the electronic device 100 can be calibrated or reset to obtain correct information concerning the environmental information, or to display or carry out other functions based on correct information from the internal sensors of the electronic device 100.

The sampling circuit 30 is used for generating a direct-voltage signal according to a change of the duty cycle of the PWM signal and transmitting the direct-voltage signal to the sensor 20 being tested. The sampling circuit 30 further samples the direct-voltage signal which is output by the sensor 20 to generate the sampled signal, and transmit the sampled signal to the controller 10.

The sampling circuit 30 includes a voltage-converting unit 31, an amplifier 33, and a sampling unit 35. The voltage-converting unit 31 is used to convert the PWM signal to a direct-voltage signal which changes in accordance with any change in the duty cycle of the PWM signal. The amplifier 33 is used to stabilize the output of the direct-voltage signal. The sampling unit 35 is used to sample the signal output by the sensor 20 and transmit the sampled signal to the controller 10.

Figure 2:
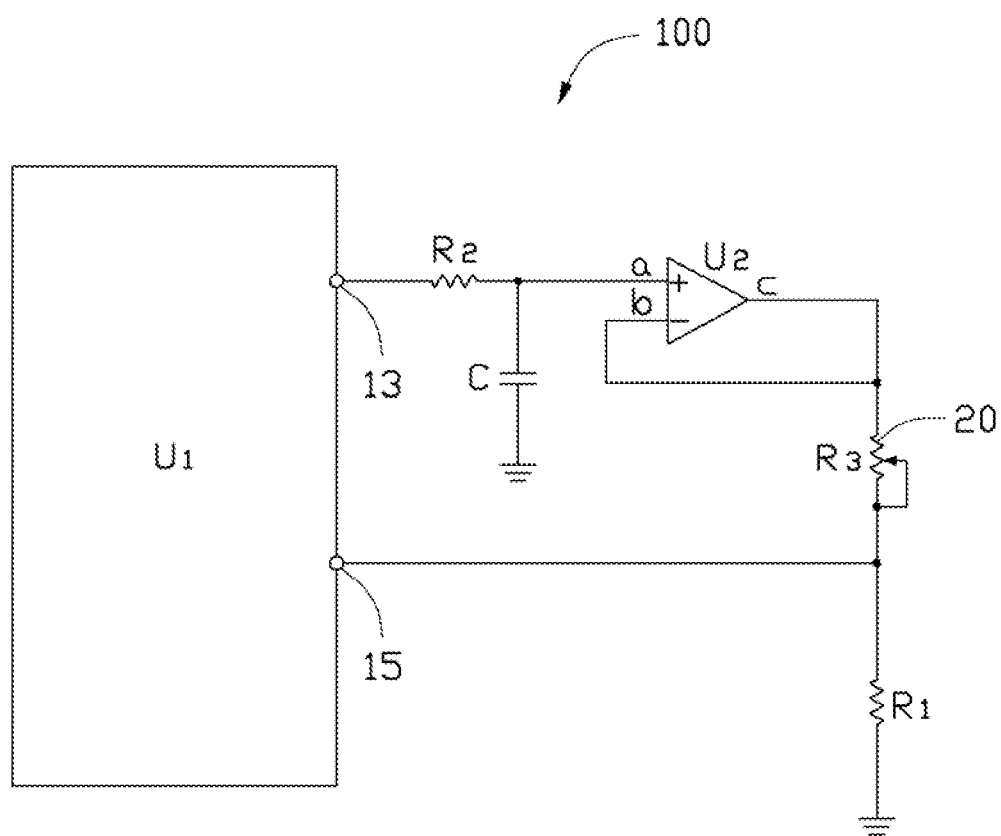
FIG. 2 is a circuit diagram of the resistance-measuring circuit of the electronic device of FIG. 1.

Referring also to FIG. 2, in the embodiment, the controller 10 is an integrated control chip U1 incorporating the PWM module 16, the adjusting module 17 and the calculating module 19. In another embodiment, the controller 10 may be a circuit incorporating merely the functions of the PWM module 16, the adjusting module 17 and the calculating module 19. The control chip U1 includes an output port 13 for outputting the PWM signal, and an input port 15 for receiving the signals for sampling.

The sampling unit 35 includes a first resistor R1. The amplifier 33 includes an operational amplifier U2. The voltage-converting unit 31 includes a capacitor C and a second resistor R2. A terminal of the second resistor R2 is electrically connected to the PWM output port 13, and the other terminal of the second resistor R2 is electrically connected to the non-inverting input a of the operational amplifier U2. A terminal of the capacitor C is electrically connected between the second resistor R2 and the non-inverting input a of the operational amplifier U2, and the other terminal of the capacitor C is grounded. The inverting input b of the operational amplifier U2 is electrically connected to the output c of the operational amplifier U2, and the output c of the operational amplifier U2 is electrically connected to a terminal of the sensor 20. The other terminal of the sensor 20 is grounded via the first resistor R1. The input port 15 of the control chip U1 is electrically connected between the sensor 20 and the first resistor R1.

The electronic device 100 works as follows: the capacitor C and the second resistor R2 form the voltage-converting unit 31 to convert the PWM signal to a direct-voltage signal which changes according to any change in the duty cycle of the PWM signal. The rising-edge voltage of the PWM signal is the working voltage Vcc of the control chip U1, the falling-edge voltage of the PWM signal is 0, and the voltage V of the direct-voltage signal is calculated according to the formula V=Vcc*Duty, wherein Duty is the duty cycle of the PWM signal. The amplification factor of the operational amplifier U2 is 1, and the operational amplifier U2 functions as a voltage follower. Thus, the voltage at the output c of the operational amplifier U2 is Vcc*Duty. The voltage at the output c is further divided by the first and second resistor R1 and R2 to form the sampled signal, and then, the sampled signal is transmitted to the input port 15 of the control chip U1. The input port 15 predefines the threshold voltage as K*Vcc, where the K is constant and indicates the relationship between the threshold voltage and the rising-edge voltage of the PWM signal. The K can be established by consulting the data manual of the control chip U1. As a result, the voltage of the sampled signal received by the input port 15 is calculated according to the following formula (I):

$$Vcc*Duty*R2/(R3+R1) \qquad (1)$$

where R2 is the resistance of the second resistor R2, R1 is the resistance of the first resistor R1, and R3 is the resistance of the sensor 20. As the threshold voltage of the input port 15 is K*Vcc, when the duty cycle of the PWM signal outputted by the output port 13 is adjusted by the adjusting module 17 and the voltage of the sampled signal reaches the threshold voltage of the input port 15, the voltage of the sampled signals satisfies: Vcc*Duty*R2/(R3+R1)=K*Vcc. Thus a value for R3 is obtained according to the formula: R3=(Duty/K−1)*R1. Therefore, by obtaining the real-time duty cycle of the PWM signals (Duty) via the calculating module 19, the resistance R3 of the sensor 20 can be precisely obtained.

The amplification factor is not limited to 1, and by adding another components, such as resistors, the amplification factor can be preset as 2, whereupon the duty cycle (Duty) is automatically adjusted to be ½.

With the assistance of the sampling unit 30, the controller 10 obtains the duty cycle of the PWM signals when the voltage of the sampled signals reaches the threshold voltage, and further calculates the resistance R3 of the sensor 20 based on the obtained duty cycle and the threshold voltage.

While various exemplary and preferred embodiments have been described, it is to be understood that the disclosure is not limited thereto. On the contrary, various modifications and similar arrangements (as would be apparent to those skilled in the art) are intended to also be covered. Therefore, the scope of the appended claims should be accorded the broadest interpretation to encompass all such modifications and similar arrangements.

What is claimed is:

1. A resistance-measuring circuit for measuring resistance of a sensor, comprising:
a controller for outputting a PWM signal and further adjusting the duty cycle of the PWM signal; and
a sampling circuit electrically connecting the controller to the sensor, and used for processing the PWM signal and transmitting the processed PWM signal to the sensor;
wherein the sampling circuit samples the signal outputted from the sensor to generate a sampled signal with the voltage thereof changing according to the change of the duty cycle of the PWM signal, and further transmits the sampled signal to the controller; the controller obtains the real-time duty cycle of the PWM signal when the voltage of the sampled signal reaches a threshold voltage, and further calculates the resistance of the sensor according to the obtained real-time duty cycle of the PWM signal and the threshold voltage; wherein the sampling circuit comprises a voltage-converting unit and a sampling unit, the voltage-converting unit is used to convert the PWM signal to a direct-voltage signal which changes according to the change of the duty cycle of the PWM signal and further transmit the direct-voltage signal to the sensor to be processed, the sampling unit is used to sample the direct-voltage signal processed by the sensor to generate the sampled signal; wherein the controller comprises an output port for outputting the PWM signal, and an input port for receiving the sampled signal generated by the sampling circuit; and wherein the sampling unit comprises a first resistor, the voltage-converting unit comprises a capacitor and a second resistor, a terminal of the sensor is electrically connected to the output port of the controller via the second resistor, the other terminal of the sensor is grounded via the first resistor; a terminal of the capacitor is electrically connected between the sensor and the second resistor, and the other terminal of the capacitor is grounded; the input port of the controller is electrically connected between the sensor and the second resistor.

2. The resistance-measuring circuit of claim 1, wherein the sampling circuit further comprises an amplifier for electrically connecting the voltage-converting unit to the sensor, the amplifier is used to process the direct-voltage signal to stabilize the output of the voltage-signal.

3. The resistance-measuring circuit of claim 2, wherein the amplifier comprises an operational amplifier, the non-inverting input of the operational amplifier is electrically connected to the output port of the controller and is further grounded via the capacitor; the inverting input of the operational amplifier is electrically connected to the output of the operational amplifier.

4. The resistance-measuring circuit of claim 3, wherein the resistance of the sensor is obtained according to the formula: R3=(Duty/K−1)*R1; R1 is the resistance of the first resistor, Duty is the real-time duty of the PWM signal when the voltage of the sampled signal reaches the threshold voltage, and K is a constant and indicates the relationship between the threshold voltage and the rising-edge voltage of the PWM signal.

5. The resistance-measuring circuit of claim 4, wherein the rising-edge voltage of the PWM signal is the work voltage of the controller, and the failing-edge voltage of the PWM signal is 0.

6. The resistance-measuring circuit of claim 1, wherein the controller comprises a Pulse Width Modulation (PWM) module for generating a PWM signal, an adjusting module for adjusting the duty cycle of the PWM signal to adjust the voltage of the sampled signal, and a calculating module for obtaining the real-time duty cycle of the PWM signal when the voltage of the sampled signal reaches a threshold voltage, and further calculating the resistance of the sensor according to the real-time duty cycle and the threshold voltage.

7. An electronic device comprising:
a sensor; and
a resistance-measuring circuit for measuring the resistance of the sensor, the resistance-measuring circuit comprising:
a controller for outputting a PWM signal and further adjusting the duty cycle of the PWM signal; and
a sampling circuit electrically connecting the controller to the sensor, and used for processing the PWM signal and transmitting the processed PWM signal to the sensor;
wherein the sampling circuit samples the signal outputted from the sensor to generate a sampled signal with the voltage thereof changing according to the change of the duty cycle of the PWM signal, and further transmits the sampled signal to the controller; the controller obtains the real-time duty cycle of the PWM signal when the voltage of the sampled signal reaches a threshold voltage, and further calculates the resistance of the sensor according to the obtained real-time duty cycle of the PWM signal and the threshold voltage; wherein the sampling circuit comprises a voltage-converting unit and a sampling unit, the voltage-converting unit is used to convert the PWM signal to a direct-voltage signal which changes according to the change of the duty cycle of the PWM signal and further transmit the direct-voltage signal to the sensor to be processed, the sampling unit is used to sample the direct-voltage signal processed by the sensor to generate the sampled signal; wherein the controller comprises an output port for outputting the PWM signal, and an input port for receiving the sampled signal generated by the sampling circuit; and wherein the sampling unit comprises a first resistor, the voltage-converting unit comprises a capacitor and a second resistor, a terminal of the sensor is electrically connected to the output port of the controller via the second resistor, the other terminal of the sensor is grounded via the first resistor; a terminal of the capacitor is electrically connected between the sensor and the second resistor, and the other terminal of the capacitor is grounded; the input port of the controller is electrically connected between the sensor and the second resistor.

8. The electronic device of claim 7, wherein the sampling circuit further comprises an amplifier for electrically connecting the voltage-converting unit to the sensor, the amplifier is used to process the direct-voltage signal to stabilize the output of the voltage-signal.

9. The electronic device of claim 8, wherein the amplifier comprises an operational amplifier, the non-inverting input of the operational amplifier is electrically connected to the output port of the controller and is further grounded via the capacitor; the inverting input of the operational amplifier is electrically connected to the output of the operational amplifier.

10. The electronic device of claim 9, wherein the resistance of the sensor is obtained according to the formula: $R3=(Duty/K-1)*R1$; $R1$ is the resistance of the first resistor, Duty is the real-time duty of the PWM signal when the voltage of the sampled signal reaches the threshold voltage, the K is constant and indicates the relationship between the threshold voltage and the rising-edge voltage of the PWM signal.

11. The electronic device of claim 10, wherein the rising-edge voltage of the PWM signal is the work voltage of the controller, and the failing-edge voltage of the PWM signal is 0.

12. The electronic device of claim 7, wherein the controller comprises a Pulse Width Modulation (PWM) module for generating a PWM signal, an adjusting module for adjusting the duty cycle of the PWM signal to adjust the voltage of the sampled signal, and a calculating module for obtaining the real-time duty cycle of the PWM signal when the voltage of the sampled signal reaches a threshold voltage, and further calculating the resistance of the sensor according to the real-time duty cycle and the threshold voltage.

* * * * *